(12) United States Patent
Doluca et al.

(10) Patent No.: US 12,731,637 B2
(45) Date of Patent: Sep. 8, 2026

(54) MULTI-PORT STATIC RANDOM-ACCESS MEMORY (SRAM) WITH BUFFERED READ PORT AND P AND N PASS GATES TO SAME WRITE BIT LINE

(71) Applicant: Aril Computer Corporation, Los Altos, CA (US)

(72) Inventors: Sinan Doluca, Saratoga, CA (US); Thomas Riordan, Los Altos, CA (US)

(73) Assignee: Aril Computer Corporation, Los Altos, CA (US)

( * ) Notice: Subject to any disclaimer, the term of this patent is extended or adjusted under 35 U.S.C. 154(b) by 90 days.

(21) Appl. No.: 18/671,872

(22) Filed: May 22, 2024

(65) Prior Publication Data

US 2025/0364040 A1 Nov. 27, 2025

(51) Int. Cl.
*G11C 11/419* (2006.01)
*G11C 5/06* (2006.01)
*G11C 11/418* (2006.01)

(52) U.S. Cl.
CPC ............ *G11C 11/419* (2013.01); *G11C 5/063* (2013.01); *G11C 11/418* (2013.01)

(58) Field of Classification Search
CPC ...... G11C 11/418; G11C 11/419; G11C 5/063
USPC .................................................. 365/189.011
See application file for complete search history.

(56) References Cited

U.S. PATENT DOCUMENTS 5,706,226 A * 1/1998 Chan ...................... H10B 10/12 257/E27.099
7,177,177 B2 2/2007 Chuang et al.
7,606,062 B2 * 10/2009 Hsu ...................... G11C 11/419 365/185.01
7,609,541 B2 10/2009 Burnett et al.
7,660,149 B2 2/2010 Liaw
7,782,656 B2 8/2010 Hsueh et al.
7,808,812 B2 10/2010 Liu et al.
8,111,542 B2 2/2012 Wu et al.
8,451,652 B2 5/2013 Seikh et al.
8,654,575 B2 2/2014 Deng
8,913,455 B1 * 12/2014 Camarota .......... H10D 84/0165 365/189.04
9,142,285 B2 9/2015 Hwang et al.

(Continued)

FOREIGN PATENT DOCUMENTS

CN 101923893 B 7/2013
CN 116206650 A 6/2023

*Primary Examiner* — Sung Il Cho

(74) *Attorney, Agent, or Firm* — gPatent LLC; Stuart T Auvinen

(57) ABSTRACT

A multi-port memory cell has a write-only cell and a buffered read port. The write-only cell has cross-coupled inverters and transmission gates to write bit lines. Each transmission gate has n-channel and p-channel transistors in parallel that both turn on during writing but remain off for reading. A node in the cross-coupled inverters is applied to a gate of a buffer transistor that has a channel in series with a channel of a read pass transistor to a read bit line. The buffered read port can be an inverter and a transmission gate, or can have p-channel and n-channel buffer and pass transistors in a four-transistor stack. The number of p-channel and n-channel transistors can be equal for use in a standard-cell or macro library layout, and the standard-cell logic power supply can be used for the memory cells even for ultra-low supply voltages.

2 Claims, 11 Drawing Sheets

(56) References Cited

U.S. PATENT DOCUMENTS

| | | | | |
|---|---|---|---|---|
| 9,627,043 | B1 | 4/2017 | Moharir | |
| 10,978,143 | B2 | 4/2021 | Braceras et al. | |
| 11,170,844 | B1 * | 11/2021 | Doluca | H10B 10/12 |
| 11,276,458 | B2 | 3/2022 | Ji et al. | |
| 11,894,049 | B1 * | 2/2024 | Asenov | G11C 11/419 |
| 2022/0108742 | A1 * | 4/2022 | Li | G11C 11/54 |
| 2024/0055048 | A1 * | 2/2024 | Sinangil | G11C 11/418 |
| 2024/0257867 | A1 | 8/2024 | You et al. | |
| 2024/0282364 | A1 | 8/2024 | You et al. | |
| 2025/0006282 | A1 | 1/2025 | Chang et al. | |
| 2025/0316306 | A1 | 10/2025 | You et al. | |

* cited by examiner

MULTI-PORT STATIC RANDOM-ACCESS MEMORY (SRAM) WITH BUFFERED READ PORT AND P AND N PASS GATES TO SAME WRITE BIT LINE

FIELD OF THE INVENTION

This invention relates to Static Random-Access Memory (SRAM), and more particularly to SRAM with a buffered read port.

BACKGROUND OF THE INVENTION

Semiconductor memories such as Static Random-Access Memory (SRAM) scale their supply voltages as cell transistors shrink in size with improving semiconductor processing technologies. A traditional SRAM cell has four transistors that form a latch that stores a bit of data, and two pass transistors that connect the latch to a pair of bit lines. Both reading and writing of the cell are performed through these pass transistors in the traditional six-transistor 6T SRAM cell.

Scaling of supply voltage has been possible in advanced node Complementary Metal-Oxide-Semiconductor (CMOS) Fin Field-Effect Transistor (FinFET) processes by trading off performance and clock frequency against power consumption. Dynamic voltage scaling and frequency scaling can be used to optimize performance and power consumption.

Supply-voltage scaling problems can occur due to read signal margin and write signal margin requirements. To improve these margin requirements, some semiconductor foundries require a higher memory supply voltage (VDDM) to SRAM building blocks than the supply voltage to other logic (VDD).

SRAMs are sometimes available as a macro cell in a standard cell or similar design library. Ideally, the SRAM should use the same supply voltage (VDD) as the logic cells in the macro library. Additional voltage conversion circuits are needed when the SRAM has a different supply voltage. These additional voltage conversion circuits are undesirable.

In some cases, designers have chosen to use latches with buffered read access ports to design Ultra-Low-Voltage (ULV) SRAM macros. The tradeoff is that layout area is compromised for voltage scaling capability.

SRAM cells with multiple ports are sometimes needed in standard cell designs. While a traditional 6T SRAM cell has a shared read/write port that uses the same pass transistors and bit lines for both reading and writing, other multiport SRAM cells have separate transistors and bit lines for reading and writing.

For example, a traditional 8 transistor (8T) SRAM cell has 1 Read port and 1 Write port (1R1W). Reading is performed through separate transistors and bit lines that are not used for writing. Voltage scaling is limited due to writability of the cell at low voltages. The cell is very NMOS dominant with 6 NMOS and 2 PMOS devices. This imbalance leads to a less-than-optimum footprint in layout area.

Not all SRAM cell structures are a good fit for the transistor layout footprint used by standard cell or macro libraries. These library cells are optimized for logic cells. Logic cells tend to have an equal number of p-channel (PMOS) and n-channel (NMOS) transistors. Thus the area in the layout that is allocated for macro cells tend to allow for an equal number of NMOS and PMOS transistors. When a standard all-NMOS 6T SRAM cell is used, with 6 NMOS and no PMOS transistors, the area reserved for PMOS can be wasted.

What is desired is a multi-port SRAM cell that is optimized for standard cell macro libraries. A SRAM cell with an equal number of PMOS and NMOS transistors is desired to better fit into the layout of logic cells in a standard cell library. A balanced PMOS/NMOS SRAM cell that can operate at ultra-low supply voltages is desirable. A multi-port SRAM cell with a buffered read port to read bit lines, and a separate write port with both NMOS and PMOS pass transistors to the write bit lines is desired to allow for full CMOS complimentary writing into the cell, even at very low voltages. A balanced PMOS/NMOS multi-port SRAM cell that does not require external read or write assist circuitry is desired.

DETAILED DESCRIPTION

The present invention relates to an improvement in multi-port SRAM. The following description is presented to enable one of ordinary skill in the art to make and use the invention as provided in the context of a particular application and its requirements. Various modifications to the preferred embodiment will be apparent to those with skill in the art, and the general principles defined herein may be applied to other embodiments. Therefore, the present invention is not intended to be limited to the particular embodiments shown and described, but is to be accorded the widest scope consistent with the principles and novel features herein disclosed.

Figure 1:
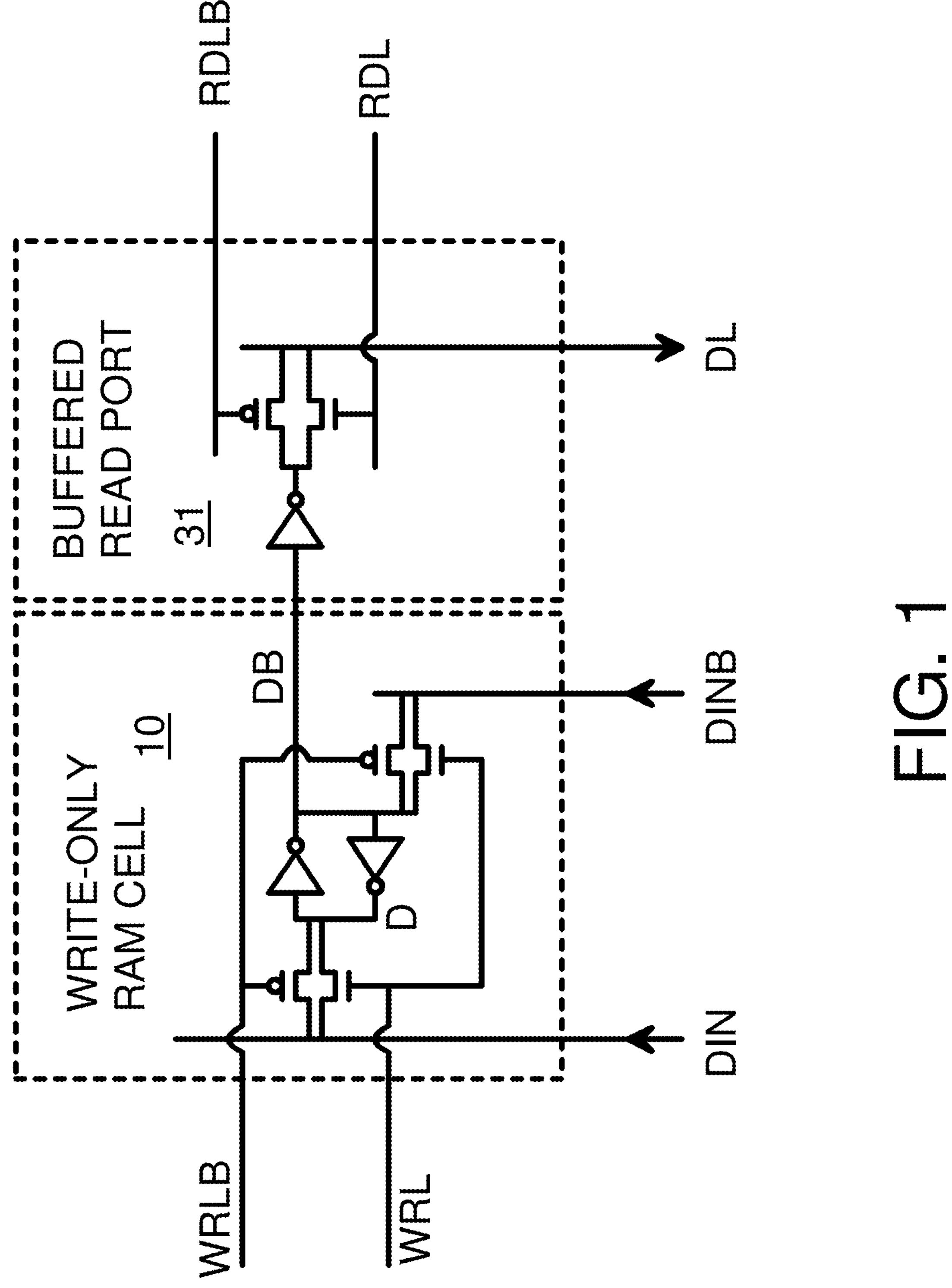
FIG. 1 is a diagram of a multiport SRAM cell with a write-only RAM with both P and N transistors in parallel to write bit lines, and a buffered read port to a read data line.

FIG. 1 is a diagram of a multiport SRAM cell with a write-only RAM with both P and N transistors in parallel to write bit lines, and a buffered read port to a read data line. Cell 10 stores one bit of data D in a latch created by cross-coupled inverters. Cell 10 is written when the row is selected by Write Row Line (WRL) being high and WRLB being low. WRLB is the inverse of WRL. WRL high turns on the n-channel pass transistors and WRLB low turns on the p-channel pass transistors, so all four pass transistors are turned on when writing. The input data on write bit line DIN drives through both n-channel and p-channel pass transistors to node D in the cell latch, while inverse input data on write bit line DINB drives through another pair of n-channel and p-channel pass transistors to inverse node DB in the cell latch. Thus the cell latch is written by differential data through two very low impedance transmission gates. This allows for a fast write even when ultra-low power-supply voltages are used. Cell write margin is very good.

The overall cell margin and stability is further enhanced by using buffered read port 31. A traditional read port has pass transistors from the cell latch to one or two read bit lines. When the read row is selected and the read pass transistors turn on, charge sharing occurs between the read bit lines and the cell latch. This charge sharing can disturb the cell latch, perhaps causing loss of the data being stored at the margin conditions.

Instead, in a simple embodiment buffered read port 31 has the cell latch's inverse data node DB applied to the input of an inverter. Since the inverter input is typically the gates of a pair of n-channel and p-channel transistors, there is little or no charge sharing between buffered read port 31 and the cell latch in cell 10. The buffered data from the cell latch is driven by the inverter in buffered read port 31 through a pair of p-channel and n-channel transistors to a read data line DL when the read row is selected with RDL high and RDLB low.

Cell 10 is not directly read except through buffered read port 31, so cell 10 is a write-only RAM cell. Write-only RAM cell 10 and buffered read port 31 together form a 1R1W SRAM cell.

Note that writing and reading can be performed asynchronously to each other, and even simultaneously. Reads do not disturb the cell state in write-only RAM cell 10, so reads can occur at any time. If a read occurs just as a write is changing the state of write-only RAM cell 10, then the read can return unstable data, but this is the actual data state of write-only RAM cell 10 as it is changing state.

Figure 3:
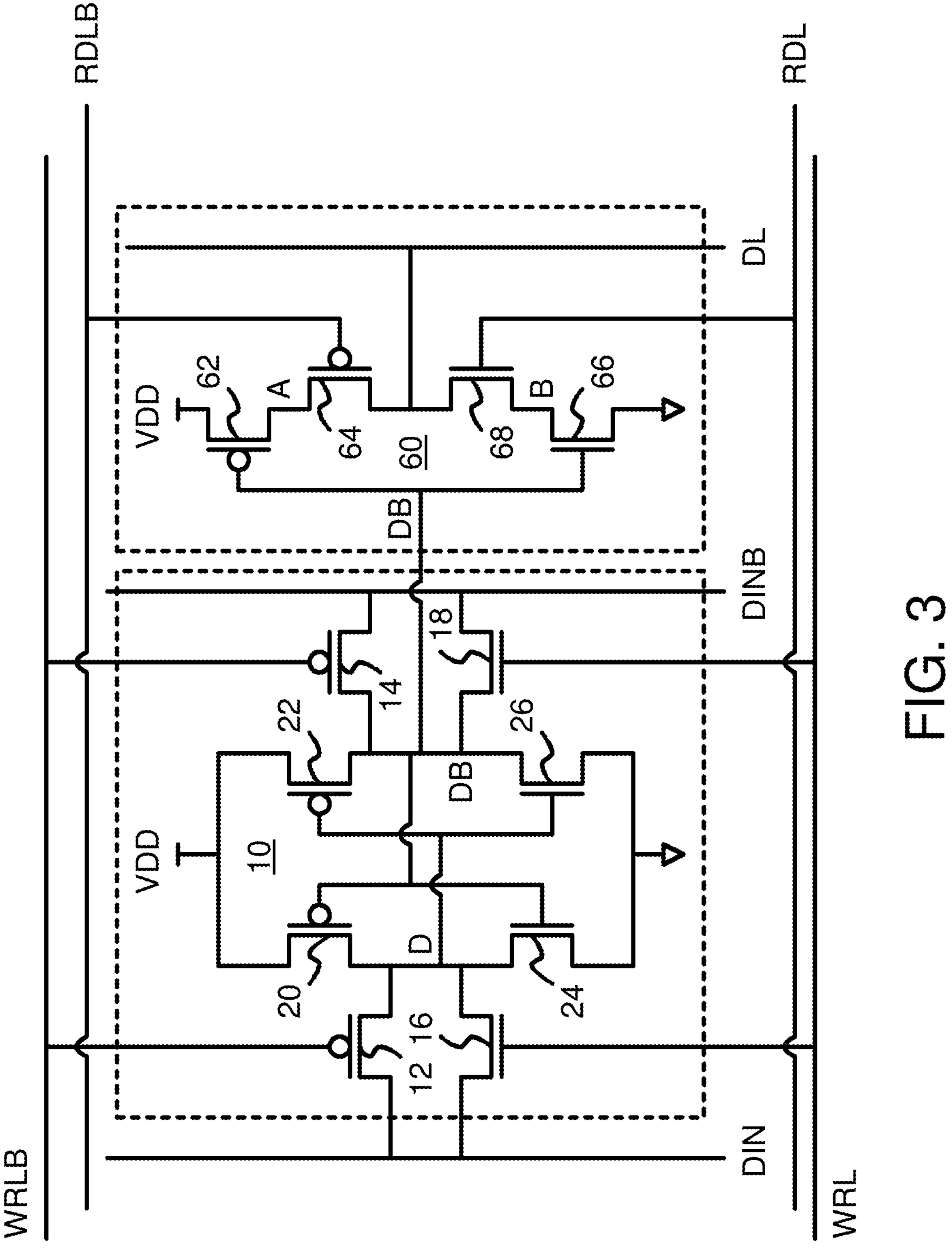
FIG. 3 is a schematic diagram of a write-only RAM cell with a tri-state buffer read port.
Figure 5:
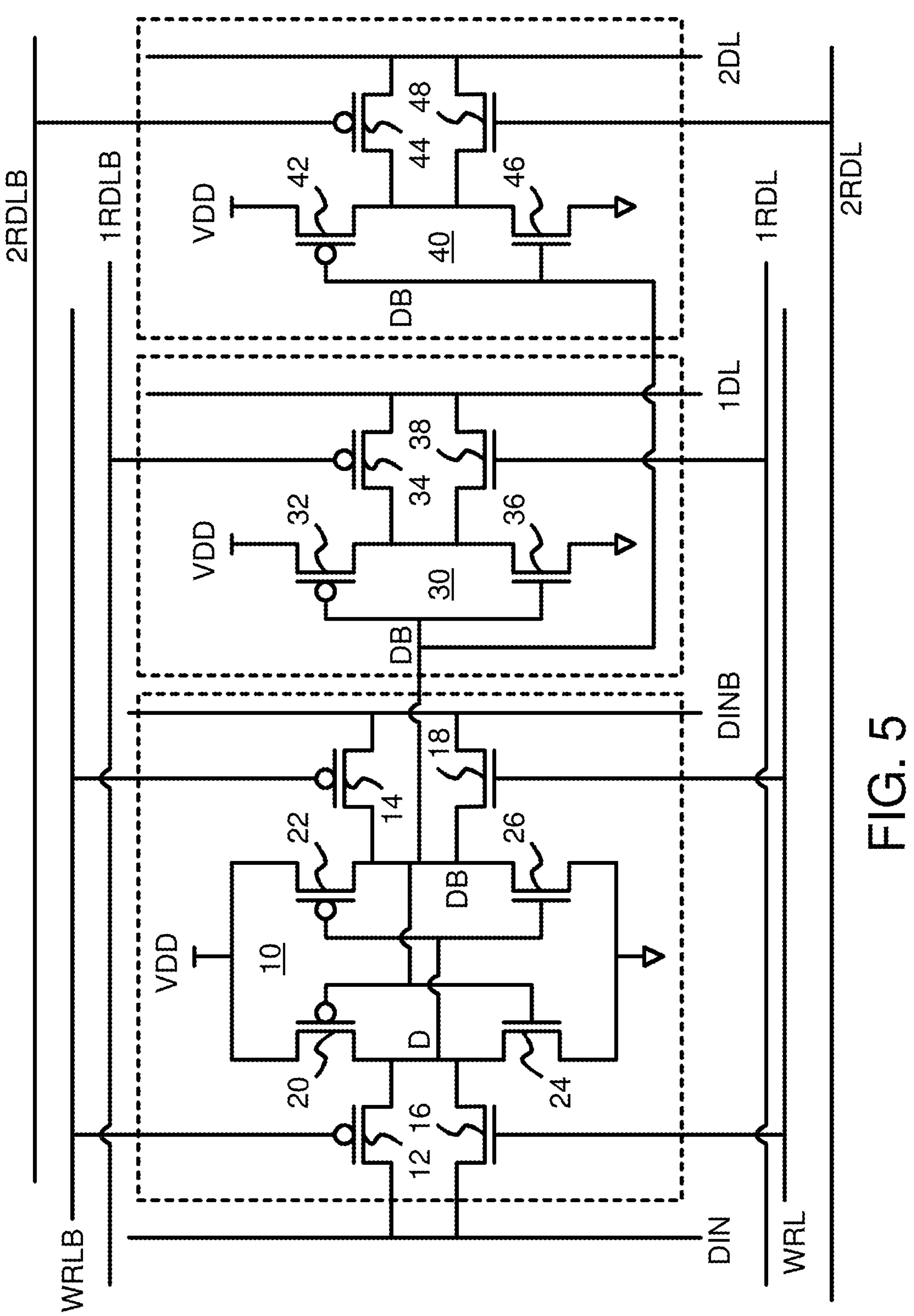
FIG. 5 shows a 2R1W multiport RAM cell.
Figure 6:
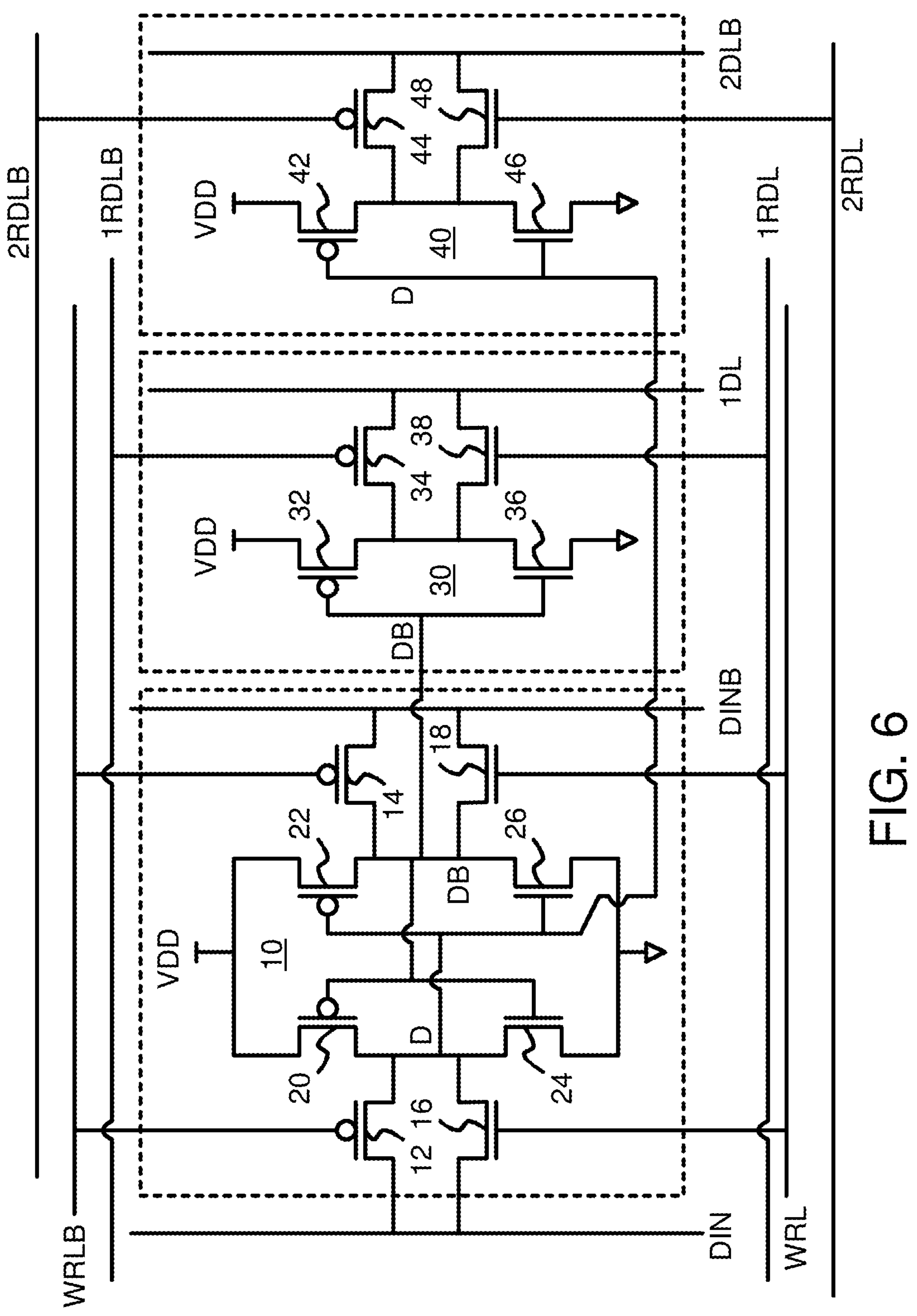
FIG. 6 shows a 2R1W multiport RAM cell with balanced loading.

In its simplest form, buffered read port 31 can be an inverter and a transmission gate. Other forms of buffered read port 31, such as shown in FIGS. 3-4, also do not disturb write-only RAM cell 10 because they only receive cell nodes D or DB on the gates of transistors, thus preventing charge sharing with the latch. Three-port and larger cells can be constructed by having two or more instances of buffered read port 31 for each write-only RAM cell 10, such as shown in FIGS. 5-6.

Figure 2:
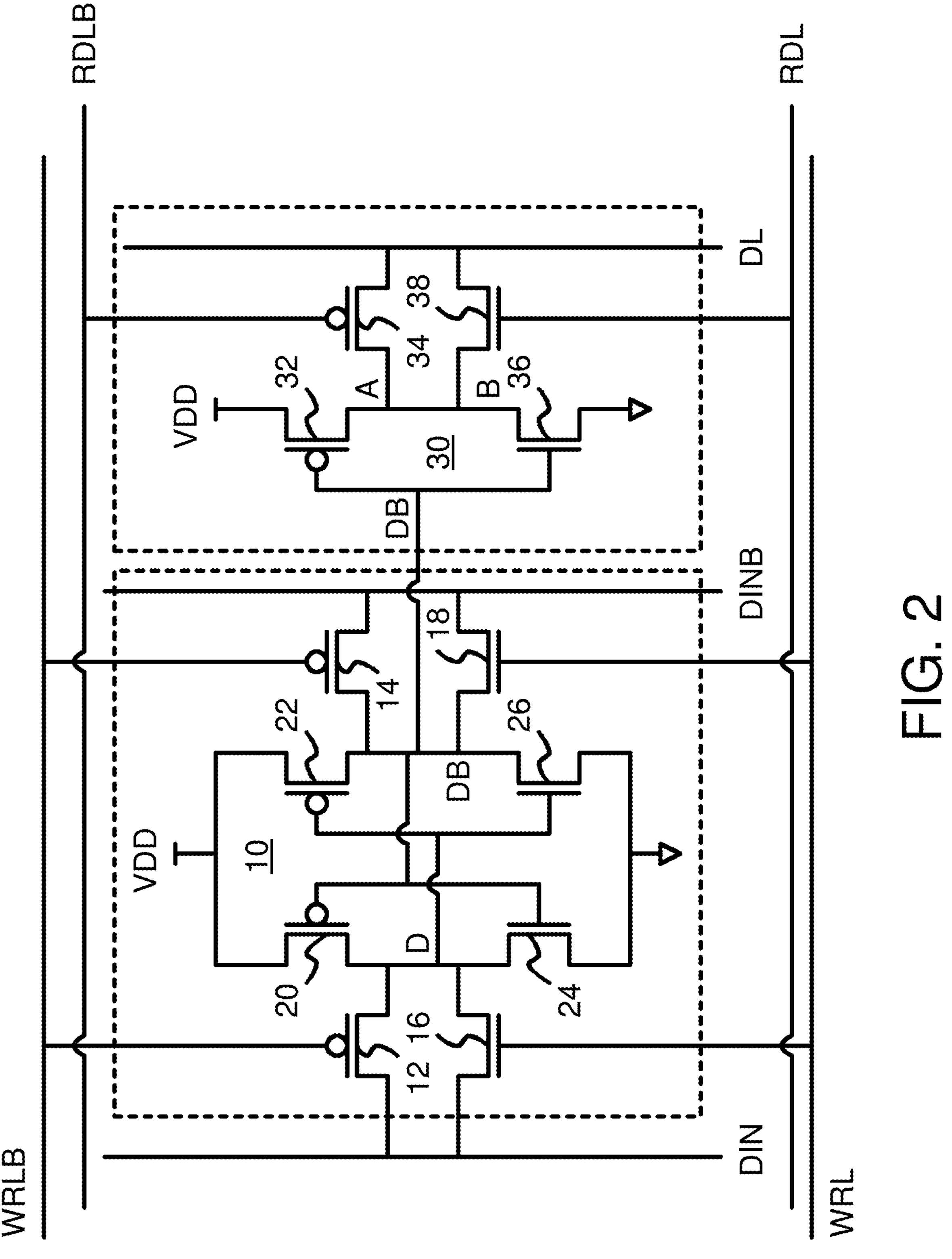
FIG. 2 is a schematic of a write-only RAM cell with a buffered read port having an inverter and a transmission gate.

FIG. 2 is a schematic of a write-only RAM cell with a buffered read port having an inverter and a transmission gate. Write-only RAM cell 10 stores a bit of data D in a latch formed by two inverters.

The drains of p-channel transistor 20 and n-channel transistor 24 are connected together at data node D and to the gates of p-channel transistor 22 and n-channel transistor 26, which have their drains connected together and to the gates of p-channel transistor 20 and n-channel transistor 24, forming a pair of cross-coupled inverters. The drains of transistors 22, 26 drive the inverse data node DB of the cell latch. The sources of n-channel transistors 24, 26 connect to ground, while the sources of p-channel transistors 20, 22 connect to the power supply VDD. VDD is the same ultra-low voltage supply used by the logic gates and macros in a standard cell design.

As with a traditional 6T SRAM cell, only a single pair of bit lines DIN, DINB, connect to write-only RAM cell 10. However, full transmission gates are provided to connect the cell latch to the write bit lines DIN, DINB.

During a write operation, write word line WRLB drives the gates of p-channel pass transistors 12, 14 low, allowing bit line DIN to drive the drains of transistors 20, 24 through p-channel pass transistor 12, and allowing complementary bit line DINB to drive the drains of transistors 22, 26 through p-channel pass transistor 14, thus writing data into cell 10.

To improve the write margin, both P and N pass transistors are turned on for a write, so that p-channel pass transistor 12 and n-channel pass transistor 16 act as a transmission gate between the cell latch and bit line DIN. Likewise, p-channel pass transistor 14 and n-channel pass transistor 18 act as a transmission gate to DINB.

During a write, write word line WRL is activated by driving it high, and inverse write word line WRLB is also activated by driving it low, so that all pass transistors 12, 14, 16, 18 are turned on.

Reading is performed by buffered read port 30. Write-only RAM cell 10 is not capable of performing a read operation since no sense amplifiers or read circuitry is attached to the write bit lines DIN, DINB. Write bit line DIN is driven with the write data by a bit-line driver and inverse write bit line DINB is driven with the inverse write data by another bit-line driver. Write row line WRL is only activated during a valid write operation and is not activated for a read operation. Thus pass transistors 12, 14, 16, 18 only turn on during a valid write operation and remain off during reads to isolate the latch inside write-only RAM cell 10.

The inverse data node DB from the latch in write-only RAM cell 10 is applied to the gates of p-channel transistor 32 and n-channel transistor 36, which form an inverter that buffers inverse node DB from the read bit line DL. The drains of transistors 32, 36 connect together and to the transmission gate. The transmission gate has n-channel transistor 38 and p-channel transistor 34 in parallel between the inverter output, the drains of transistors 32, 36, and the read bit line DL.

During a read operation, a row is selected by driving read row line RDL high and inverse read row line RDLB low. All other non-selected rows in the array are disabled by having their RDL low and RDLB high. RDL high is applied to the gate of n-channel transistor 38, turning it on, while RDLB low is applied to the gate of p-channel transistor 34, turning it on. With both transistors 34, 38 on, a low-impedance path is provided, allowing the inverter (drains of transistors 32, 36) to drive read bit line DL.

The read speed can be faster using a full transmission gate than if using only a n-channel transistor, especially for high data. A second read bit line and differential sensing is not needed since the inverter can rapidly drive the single read bit line DL through the low-impedance transmission gate. Thus read sensing circuitry around the memory cell array can be less complex.

The overall cell is symmetric and does not require dummy transistors. There are 6 NMOS transistors and 6 PMOS transistors for a total of 12 transistors (12T). Write-only RAM cell 10 has 8 transistors while buffered read port 30 has 4 transistors. The overall cell uses only VDD, which is applied to the sources of p-channel transistors 20, 22, 32.

FIG. 3 is a schematic diagram of a write-only RAM cell with a tri-state buffer read port. In this variation, buffered read port 60 has a tri-state inverter. The transmission gate is integrated into the inverter. Write-only RAM cell 10 is the same as described for FIG. 2.

Buffered read port 60 has a single logic gate that receives inverse data node DB on the gates of p-channel transistor 62 and n-channel transistor 66. The source of p-channel transistor 62 is connected to VDD, while its drain connects to the source of p-channel transistor 64. The gate of p-channel transistor 64 is the inverse read row line RDLB, and its drain is read bit line DL.

Similarly, the source of n-channel transistor 66 is connected to ground, while its drain connects to the source of n-channel transistor 68. The gate of n-channel transistor 68 is the read row line RDL, and its drain is read bit line DL.

When the current row is not selected, or when reading is not occurring, RDL is low and RDLB is high, turning off transistors 68, 64 and isolating buffered read port 60 from read bit line DL.

When the current row is selected during a read operation, RDL is high, turning on n-channel transistor 68. RDLB is low, turning on p-channel transistor 64. Then the inverse data DB from the latch inside write-only RAM cell 10 can drive data onto read data line DL. When DB is low, p-channel transistor 62 turns on, driving DL high through p-channel transistor 64. When DB is high, n-channel transistor 66 turns on, driving DL low through n-channel transistor 66. Thus the inverted cell data DB is inverted again through buffered read port 60.

Buffered read port 60 (FIG. 3) and buffered read port 30 (FIG. 2) are considered static read ports since the read bit line is driven both high and low. Precharging of the read bit line is not required for the correct data to be read eventually.

Note that buffered read port 60 (FIG. 3) and buffered read port 30 (FIG. 2) are nearly identical, except that nodes A and B are separate in FIG. 3, but are shorted together in FIG. 2. A standard cell could be designed to have an option to short nodes A and B together when buffered read port 30 is desired, but to not short nodes A and B together when buffered read port 60 is desired. The option could be a piece of metal that connects a contact to the diffusion for node A to a contact to the diffusion for node B.

Figure 4A:
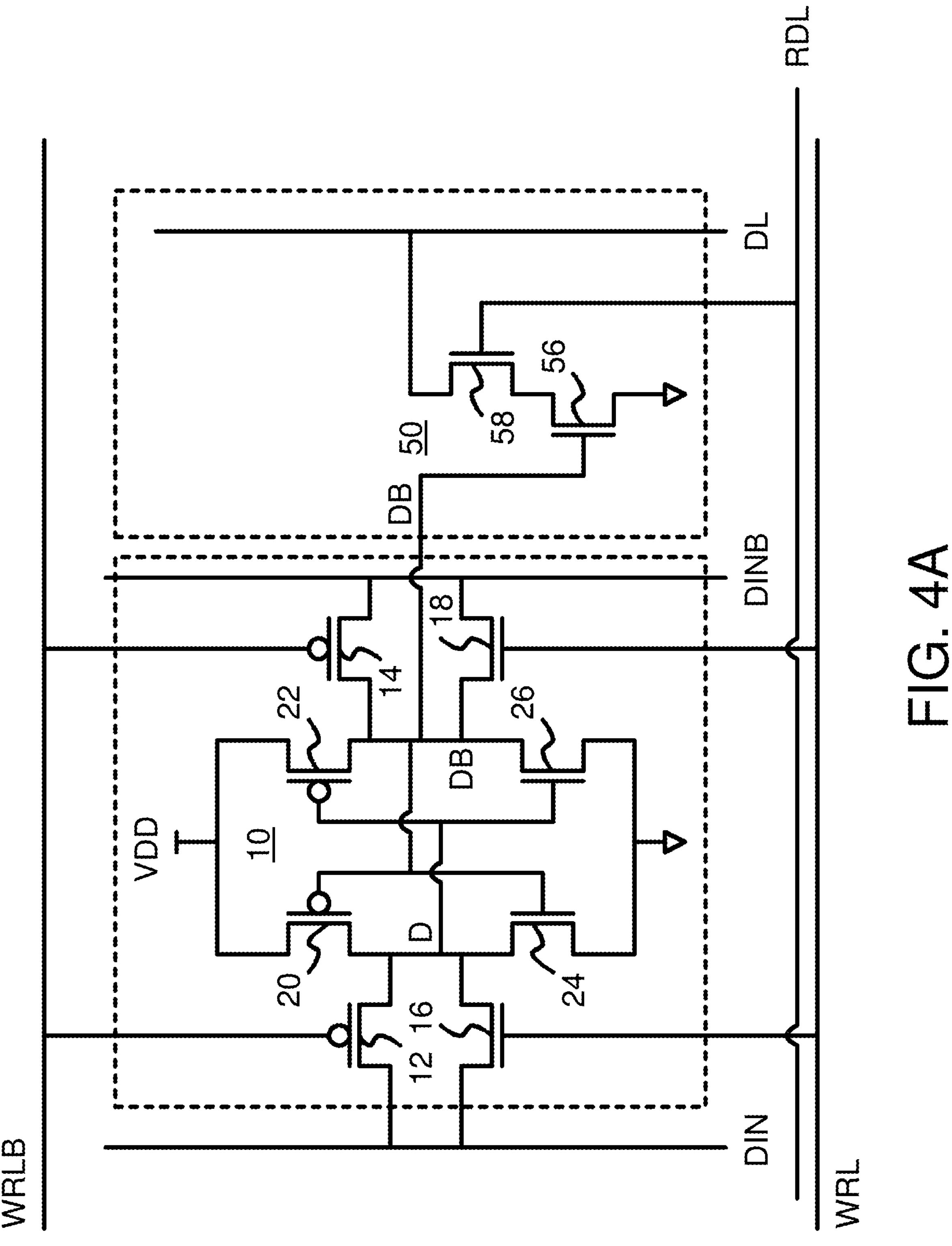
FIG. 4A shows a dynamic buffered read port for a write-only RAM cell.

FIG. 4A shows a dynamic buffered read port for a write-only RAM cell. The read bit line DL can be precharged high before each read operation, and then pulled low by buffered read port 50 when DB is high. When DB is low, the read bit line DL remains high and is not pulled low by buffered read port 50.

P-channel transistors 62, 64 from buffered read port 60 (FIG. 3) are deleted in this embodiment.

Inverse data DB from write-only RAM cell 10 is applied to the gate of n-channel transistor 56, which has its source grounded and its drain connected to the source of n-channel transistor 58. The read row line RDL is applied to the gate of n-channel transistor 58, which has its drain connected to read bit line DL.

When the row is selected during reading, RDL is high, turning on n-channel transistor 58. When inverse data DB is high, n-channel transistor 56 turns on, pulling read bit line DL low through n-channel transistors 58, 56. When inverse data DB is low, n-channel transistor 56 remains off, allowing read bit line DL to remain high.

This is considered a dynamic buffered read port, since the read bit line needs to be precharged high before every read. A sense amplifier that senses low-going data is attached to read bit line DL outside the memory cell array.

Figure 4B:
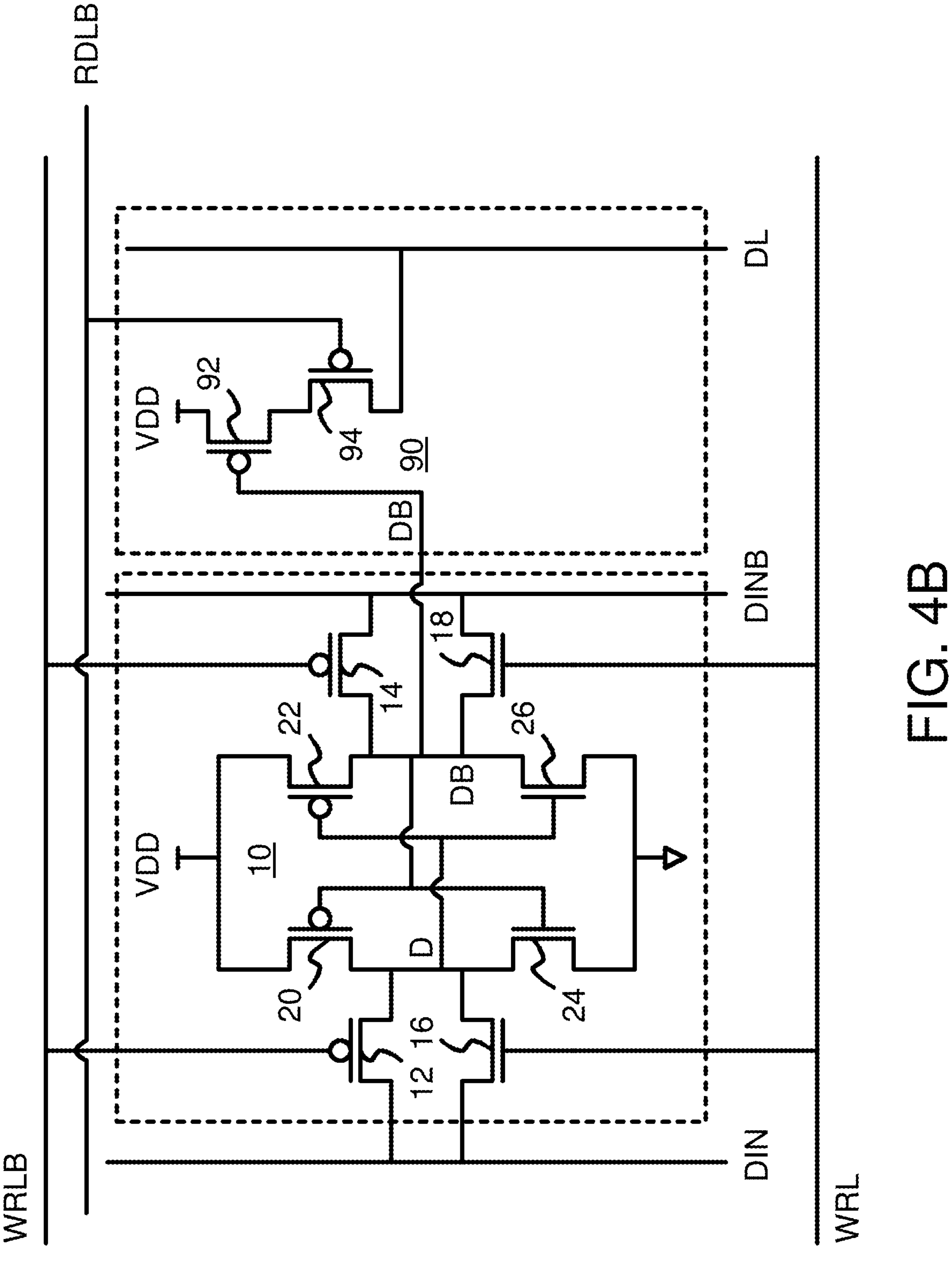
FIG. 4B shows a PMOS dynamic buffered read port for a write-only RAM cell.

FIG. 4B shows a PMOS dynamic buffered read port for a write-only RAM cell. The read bit line DL can be precharged low before each read operation, and then pulled high by buffered read port 90 when DB is low. When DB is high, the read bit line DL remains low and is not pulled high by buffered read port 90.

N-channel transistors 66, 68 from buffered read port 60 (FIG. 3) are deleted in this embodiment.

Inverse data DB from write-only RAM cell 10 is applied to the gate of p-channel transistor 92, which has its source connected to VDD and its drain connected to the source of p-channel transistor 94. The inverse read row line RDLB is applied to the gate of p-channel transistor 94, which has its drain connected to read bit line DL.

When the row is selected during reading, RDLB is low, turning on p-channel transistor 94. When inverse data DB is low, p-channel transistor 92 turns on, pulling read bit line DL high through p-channel transistors 92, 94. When inverse data DB is high, p-channel transistor 92 remains off, allowing read bit line DL to remain low.

This is considered a dynamic buffered read port, since the read bit line needs to be precharged low before every read. A sense amplifier that senses high-going data is attached to read bit line DL outside the memory cell array.

A cell array that alternates the cells of FIGS. 4A and 4B can be constructed for better layout efficiency. However, 2 different kinds of sense amplifiers may be required, one for low-going sensing and another for high-going sensing.

FIG. 5 shows a 2R1W multiport RAM cell. In this embodiment, write-only RAM cell 10 drives two buffered read ports 30, 40. A first read bit line 1DL is driven by buffered read port 30 when first read row lines 1RDL, 1RDLB are active, while a second read bit line 2DL is driven by buffered read port 40, when second read row lines 2RDL, 2RDLB are active.

Inverse data DB from write-only RAM cell 10 drives the gates of p-channel transistor 42 and n-channel transistor 46, which form the inverter in buffered read port 40 that drives second read bit line 2DL through the transmission gate of n-channel transistor 48, having a gate driven by second read row line 2RDL, and p-channel transistor 44, having a gate driven by inverse read row line 2RDLB. Buffered read port 30 operates as described for FIG. 2.

Both buffered read ports 30, 40 are driven by inverse data node DB in this embodiment. This may be undesirable as the capacitive loading is mostly on inverse data node DB, not on data node D. This unbalanced capacitive load may move the cell's flip point, causing the cell to more easily be written to 1 than to 0, because a longer period of time would be needed to write from bit line DINB through transistors 14, 18 to the large capacitive load on DB, and to write from bit line DIN through transistors 12, 16 to the small capacitive load on data node D.

FIG. 6 shows a 2R1W multiport RAM cell with balanced loading. In this embodiment, write-only RAM cell 10 drives two buffered read ports 30, 40. However, data node D drives buffered read port 40 while inverse data node DB drives buffered read port 30.

A first read bit line 1DL is driven by buffered read port 30 when first read row lines 1RDL, 1RDLB are active, while a second inverse read bit line 2DLB is driven by buffered read port 40, when second read row lines 2RDL, 2RDLB are active.

Data DB from write-only RAM cell 10 drives the gates of p-channel transistor 42 and n-channel transistor 46, which form the inverter in buffered read port 40 that drives second inverse read bit line 2DLB through the transmission gate of n-channel transistor 48, having a gate driven by second read row line 2RDL, and p-channel transistor 44, having a gate driven by inverse read row line 2RDLB. Buffered read port 30 operates as described for FIG. 2.

Buffered read ports 30 is driven by inverse data node DB while buffered read port 40 is driven by data node D in this embodiment. Capacitive loading is balanced among node D, DB, in this alternative embodiment. The latch in write-only RAM cell 10 is less likely to be disturbed or to have unbalanced writing.

Figure 7:
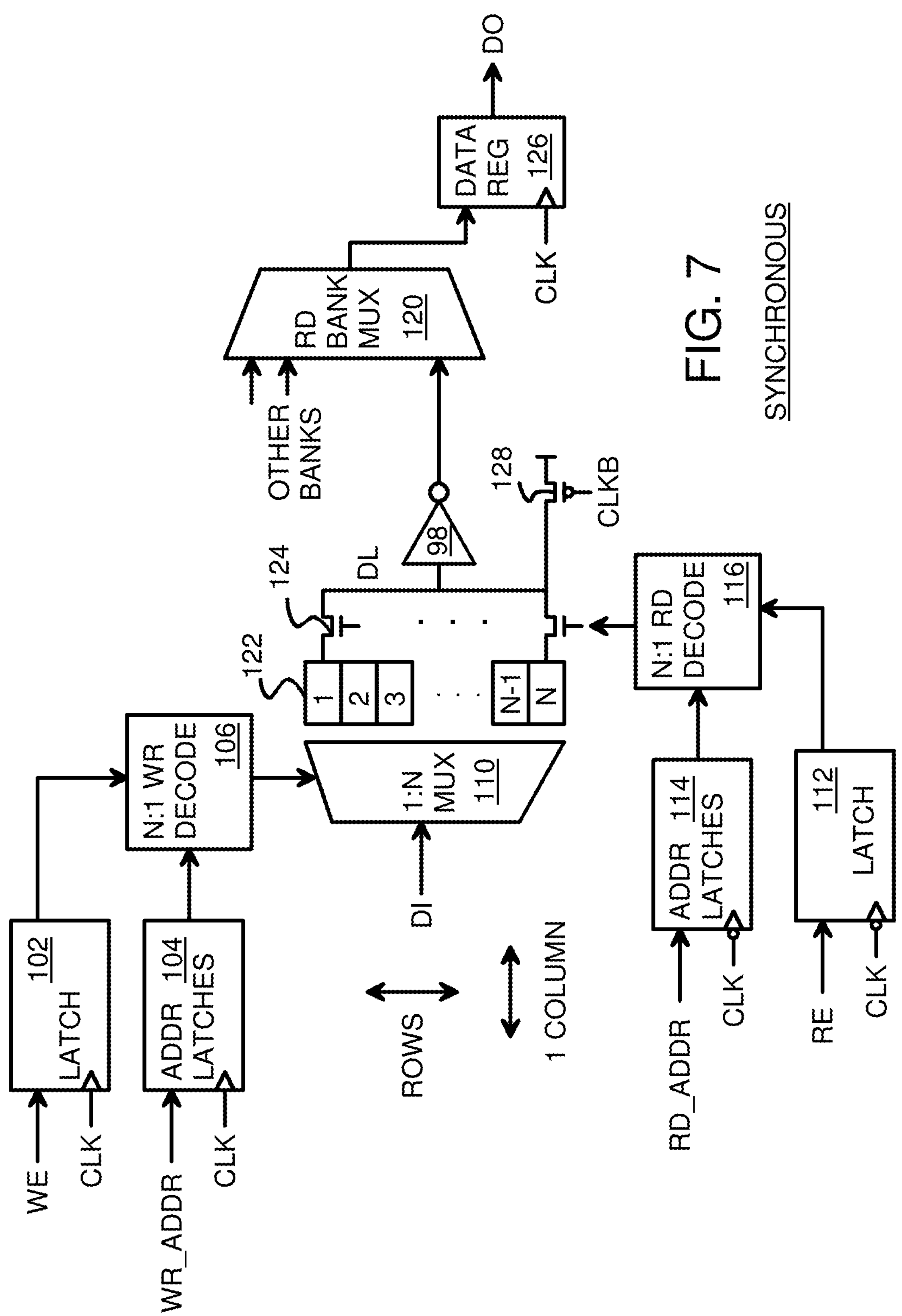
FIG. 7 shows a clocked or synchronous memory using the write-only RAM cell with a buffered read port.

FIG. 7 shows a clocked or synchronous memory using the write-only RAM cell with a buffered read port. Write-only RAM cell 10 and buffered read port 30 (FIG. 2) are arrayed into many rows and columns of cells. A single column 122 of write-only RAM cell 10 and buffered read port 30 is shown with N rows. Only pass transistor 124 is shown for buffered read port 30; the other transistors in buffered read port 30 are not shown in this simplified diagram.

Each row has two write word lines, WRL, WRLB, and two read word lines RDL, RDLB. Each column has two write bit lines DIN, DINB, that carry true and complementary write data. Each column also has one read bit line, DL.

Write data DI and write address WR_ADDR are latched by the rising edge of clock CLK. The write addresses are latched by latches 104 and then the latched address bits are decoded by decoder 106 to cause mux 110 to route write data DI to the bit lines DIN, DINB for one of the N rows. The other N−1 non-selected rows have their write word lines, WRL, WRLB, unselected to prevent writing to those cells.

A write-enable WE control signal is latched by WE latch 102 and enables decoder 106 for write operations. The write data latches are not shown and can be shared among several or all banks.

Read address RD_ADDR is latched by latch 114 while read enable RE is latched by latch 112 on the falling edge of clock CLK. When RE is latched, decoder 116 is enabled to decode the latched read address and to select one of the N rows for reading. Pass transistor 124 in buffered read port 30 is turned on for the selected read row by the enabled read row line, and then the latched data in the cell for the row selected by decoder 116 is routed through transistor 124 (buffered read port 30) to sense amplifier 98 and then muxed with other cell banks by read bank mux 120 and latched as read output data by read latch 126 in response to clock CLK. Precharge transistor 128 precharges read bit and data lines when clock CLKB is low.

The read path has precharge PMOS transistors 128 to set the data lines DL high for evaluation once the read row line RDL line is selected. The RDL lines should be valid throughout the evaluation phase and be glitch free. The read path is clocked to observe required set-hold times and there exists a rigid address set-up to clock edge and a fixed clock to Data Out delay and capture edge.

Memory cells, muxes, decoders, latches, precharge circuits all use a single power supply, VDD. VDD is also used for all logic cells in the standard cell library. Latches provide the necessary setup and hold times.

Figure 8:
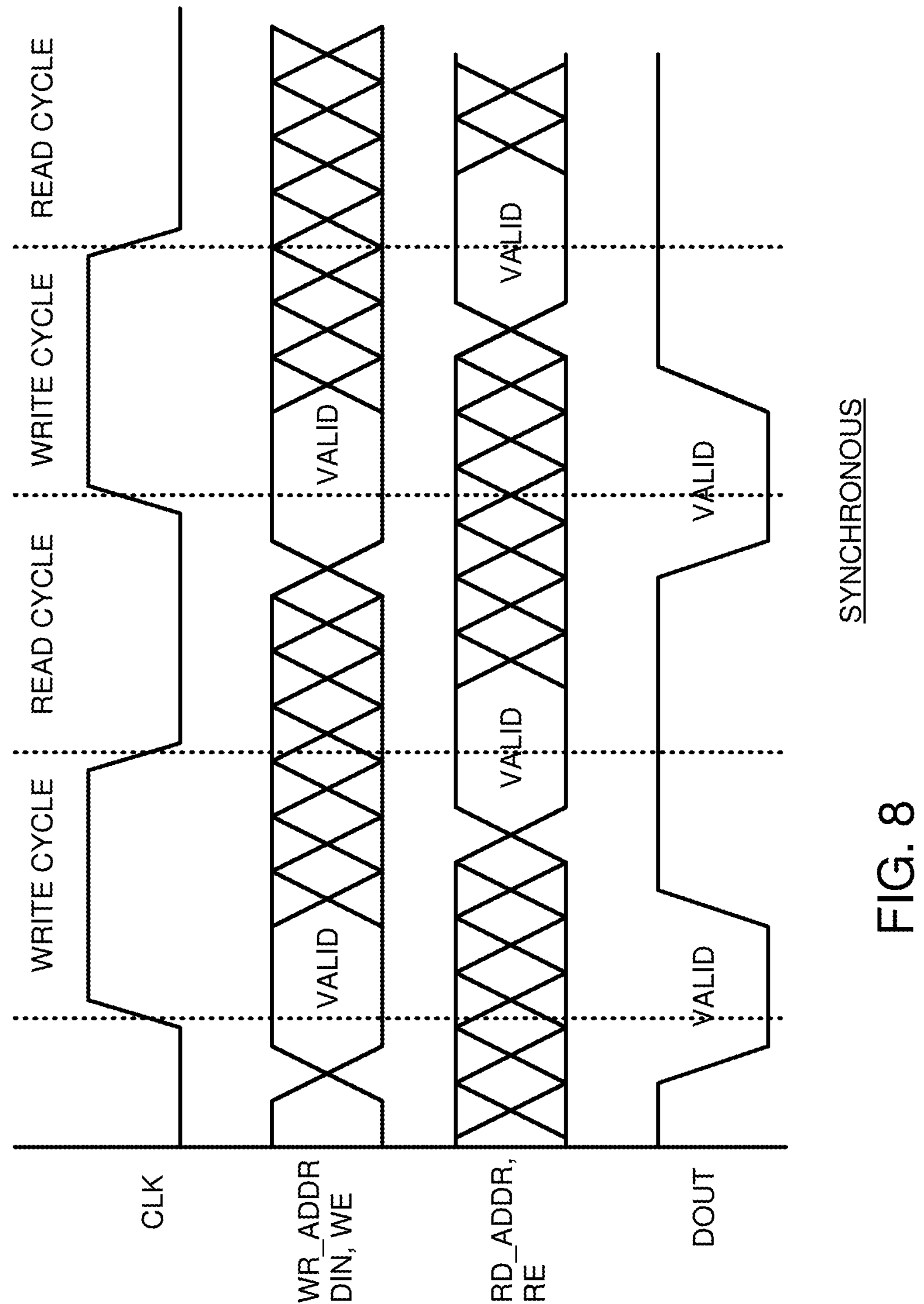
FIG. 8 is a waveform diagram of reading and writing the synchronous memory of the write-only RAM cell with the buffered read port.

FIG. 8 is a waveform diagram of reading and writing the synchronous memory of the write-only RAM cell with the buffered read port. The write address WR_ADDR, write data DIN, and write enable WE are all latched in on the rising edge of clock CLK. After latching, the write operation is performed, and the write address and data can change while writing occurs internally to the memory cells.

The read address RD_ADDR, and read enable RE are latched on the falling edge of clock CLK. The read operation begins on the falling edge of CLK. After the hold time has expired, the read address can change while the read operation continues internally. Once the read data has been read from the memory cells, it is driven onto the read outputs before the rising edge of CLK and remains valid for a short time after the rising CLK edge.

Figure 9:
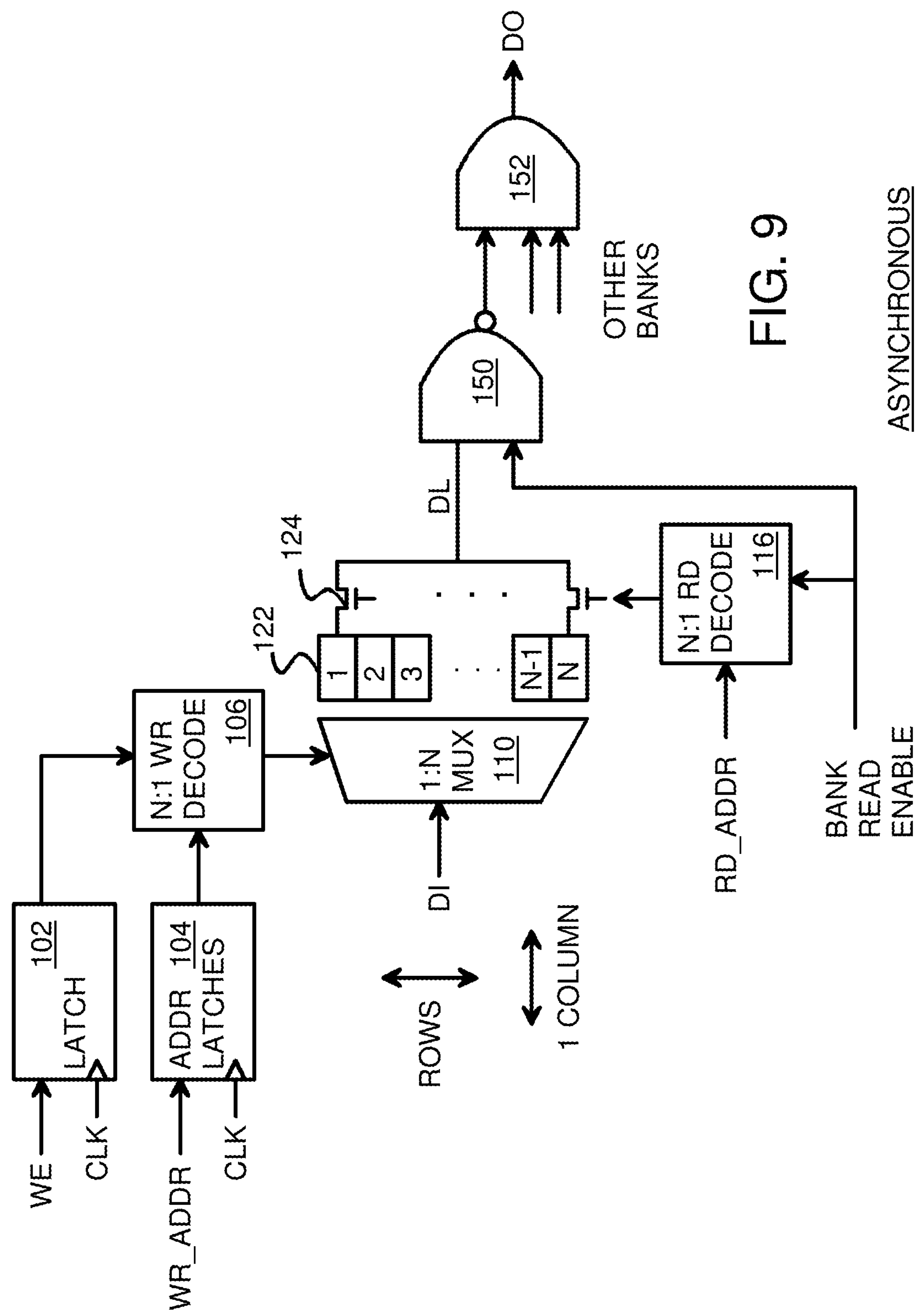
FIG. 9 shows an asynchronous memory using the write-only RAM cell with a buffered read port.

FIG. 9 shows an asynchronous memory using the write-only RAM cell with a buffered read port. Write-only RAM cell 10 and buffered read port 30 (FIG. 2) are arrayed into many rows and columns of cells. A single column 122 of write-only RAM cell 10 and buffered read port 30 is shown with N rows. Only pass transistor 124 is shown for buffered read port 30, not the other transistors in buffered read port 30.

Each row has two write word lines, WRL, WRLB, and two read word lines RDL, RDLB. Each row has two write bit lines DIN, DINB, that carry true and complementary write data. Each column also has one read bit line, DL.

Write data DI and write address WR_ADDR are latched by the rising edge of clock CLK. The write addresses are latched by latches 104 and then the latched address bits are decoded by decoder 106 to cause mux 110 to route write data DI to the bit lines DIN, DINB for one of the N rows.

A write-enable WE control signal is latched by WE latch 102 and enables decoder 106 for write operations. The write data latches are not shown in this simplified diagram.

Read address RD_ADDR is not latched. A portion of the read address can be decoded to select one bank from among M banks in a memory. The decoded bank can be AND'ed or otherwise combined with the read enable signal to generate a bank read enable signal. When the bank read enable is active, decoder 116 is enabled to decode the unlatched read address RD_ADDR to select one of the N rows for reading. The pass transistors in buffered read port 30 are turned on for the selected read row, and turned off for non-selected rows, and then the read bit line for the row selected by decoder 116 is routed through transistor 124. No sense amplifier is needed. Then the read data line DL is enabled by the bank read enable by NAND gate 150. AND gate 152 OR's together the other bank's enabled outputs to generate output data DO.

Memory cells, muxes, decoders, latches, etc. all use a single power supply, VDD. VDD is also used for all logic cells in the standard cell library. Latches provide the necessary setup and hold times for write operation.

Figure 10:
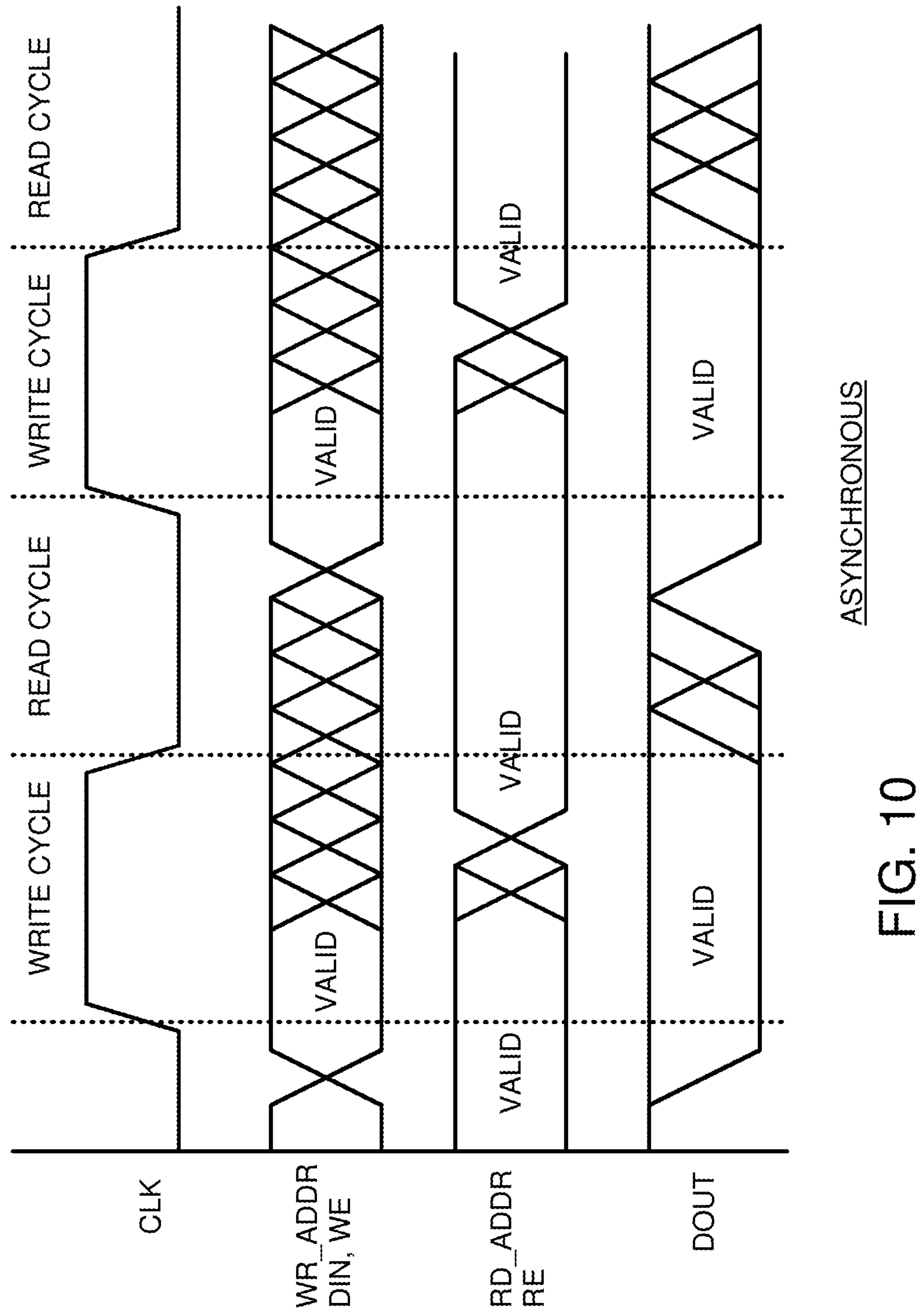
FIG. 10 is a waveform diagram of reading and writing the asynchronous memory constructed from the write-only RAM cell with the buffered read port.

FIG. 10 is a waveform diagram of reading and writing the asynchronous memory constructed from the write-only RAM cell with the buffered read port. The write address WR_ADDR, write data DIN, and write enable WE are all latched in on the rising edge of clock CLK. After latching, the write operation is performed, and the write address and data can change while writing occurs internally to the memory cells.

The read address RD_ADDR is asynchronous to the clock CLK.

The read operation begins as soon as the address becomes valid and stops changing. After a propagation delay for decoding the address and reading the memory cells, valid read output data DOUT is obtained. The read output data remains valid for a hold delay which is a shorter propagation delay after the address changes again.

Alternate Embodiments

Several other embodiments are contemplated by the inventors. A multiport SRAM cell and its macro architecture are designed to allow deep dynamic voltage and power scaling in advanced node FinFet/GAA technologies. Only a single power supply is required for a wide range of Process, supply Voltage, Temperature (PVT) conditions. Power consumption reduction of 10× may be achieved by a combination of a reduced power supply voltage and lowered operating clock frequency. In an asynchronous read cell/macro variety the address alignment with a clock is not required for a high-speed access. The 1R1W cell topology can be expanded by adding 1, 2, 3, or more additional read ports. Layout footprint is minimized for advanced node CMOS technologies because NMOS and PMOS transistor counts are balanced in the memory cells.

Write-only RAM cell 10 can be attached to one or more of buffered read port 30, 40, 50, 60. Various combinations could also be used.

While write-only RAM cell 10 with pull-up p-channel transistors 20, 22 in the cell latch have been described, pull-up resistors could replace p-channel transistors 20, 22. Various layouts of the SRAM cell are possible.

While operation of the SRAM cell has been described, various modifications can be made. The sense amplifier could be inverted and sense high-going rather than low-going bit lines. A simplified sense amplifier such as a single-ended sense buffer could be used. Using a simple single-ended sense amplifier can reduce costs for applications that do not have a strict timing requirement.

Address inputs, timing signal inputs and other inputs such as for power down or de-selection could be combined by logic within the decoders and other logic upstream to the final inverting buffers. A controller could generate various timing signals from a clock or an access request signal to obtain desired waveforms. The simple blocks of FIGS. 7, 9 may be considered to be simplifications of more complex decoders and gating logic in a real memory device. Some memory architectures may not use row and column decoders of an address, such as a first-in-first-out (FIFO) that has an array of the write-only RAM cell 10 and buffered read port 30 but uses shift registers with one high bit and the other bits low in place of the row decoders or column decoders.

Column muxing is possible, with different mux ratios such as 2:1, 8:1, etc. No column muxing within a bank is a simpler variation. Various architectures can be employed, such as a standard array of rows and columns, a folded bit line architecture, sub-array architectures, split rows or split columns, dummy rows or dummy columns, etc. Columns or rows may be split or fold over such as where two physical columns have their bit lines connected together as a single column from a schematic viewpoint. The single-bit column of FIGS. 7, 9 can be replicated Q times for Q bits in a data word. Also, the single-bit column of FIGS. 7, 9 before the input to read bank mux 120 or AND gate 152 can be replicated M times for M banks. Thus arbitrary memory sizes M×N and word lengths Q can be supported.

Various signals could be inverted. For example, the bit lines could be reset low rather than precharged high. The pre-initialized bit lines could be driven high by the selected cell rather than driven low. P-channel and n-channel transistors could be swapped. Inversions could be added or removed at various places, such as by swapping or crossing true and complement bit lines and mux lines, or adding or removing inverters or using non-inverting rather than inverting buffers.

The ground connection to the memory cells could connect to a back-bias generator that generates a body or bias voltage that is below ground. The muxing of columns may be much more complex, and there may be sub-arrays and selections of one sub-array and disabling of other sub-arrays. Masking logic may be added that could disable sensing or writing of certain bits within a multi-bit word.

The actual margin values, and the power supply VDD voltages can vary. Supply voltages can be scaled with process improvements and may be dynamically adjusted or switched in a system, such as to reduce over-heating when a temperature alarm is signaled, or when the system enters a low-power mode. A voltage regulator or filter might be added to VDD, or the natural capacitances of the memory cells may be sufficient to regulate VDD.

Many layouts of the cell are possible within the spirit of the invention, and those skilled in the art will be able to make many modifications.

The n-channel access transistor has been described as having a source diffusion connected to the bit line and a drain diffusion connected to the cross-coupled inverters. However, those skilled in the art will recognize that MOS transistors are bi-directional in nature and the source and drain diffusions are physically indistinguishable. For normal bit-line biasing, the source terminal of an n-channel transistor has a lower voltage or potential than the drain terminal, but if the applied voltage is reversed then the source and drain terminals can reverse with the drain becoming the source and vice-versa. Thus the terms "source" and "drain" are used interchangeably, and for both p-channel and n-channel transistors.

Additional leaker devices such as resistors and small transistors could be added. Parasitic capacitances and resistances may be used from some components, depending on the process and device sizes used. Bias, VDD, and voltage values may vary somewhat due to process, temperature, and design variances.

While descriptions of current flows and operations have been presented, these are theoretical, and the theories may be incomplete or even incorrect. Especially for small devices, currents may flow in unusual ways and using mechanisms that have not yet been thoroughly researched and understood. Second and third order effects may also be present.

Cutouts in diffusion and other regions may be used. Other shapes and physical layouts may be substituted, such as intermingled fingers. For FinFET transistors, fins could intersect other fins, bend, or have various macro geometries and layouts.

Devices may be implemented using n-channel, p-channel, or bipolar transistors, or junctions within these transistors, or carbon nanotubes. A capacitor could be attached to a resistance to provide an R-C time delay, or more complex circuits such as active triggering circuits may be added. In some embodiments, high-voltage transistors may be used rather than low-voltage transistors with appropriate bias conditions. The gate lengths and spacings can be increased to provide better protection from damage.

Different transistor, capacitor, resistor, and other device sizes can be used, and various layout arrangements can be used, such as multi-leg, ring, doughnut or irregular-shape transistors. Additional taps, guard rings, transistors, and other components may be added. More than one power supply may be used.

The background of the invention section may contain background information about the problem or environment of the invention rather than describing prior art by others. Thus, inclusion of material in the background section is not an admission of prior art by the Applicant.

Any advantages and benefits described may not apply to all embodiments of the invention. When the word "means" is recited in a claim element, Applicant intends for the claim element to fall under 35 USC Sect. 112, paragraph 6. Often a label of one or more words precedes the word "means". The word or words preceding the word "means" is a label intended to ease referencing of claim elements and is not intended to convey a structural limitation. Such means-plus-function claims are intended to cover not only the structures described herein for performing the function and their structural equivalents, but also equivalent structures. For example, although a nail and a screw have different structures, they are equivalent structures since they both perform the function of fastening. Claims that do not use the word "means" are not intended to fall under 35 USC Sect. 112, paragraph 6. Signals are typically electronic signals, but may be optical signals such as can be carried over a fiber optic line.

The foregoing description of the embodiments of the invention has been presented for the purposes of illustration and description. It is not intended to be exhaustive or to limit the invention to the precise form disclosed. Many modifications and variations are possible in light of the above teaching. It is intended that the scope of the invention be limited not by this detailed description, but rather by the claims appended hereto.

We claim:

1. A multi-port-cell memory comprising:

an array of memory cells, each memory cell comprising:

a first pull-up p-channel transistor having a source connected to a power supply, a drain connected to a first node, and a gate connected to a second node;

a first pull-down n-channel transistor having a source connected to a ground voltage supply, a drain connected to the first node, and a gate connected to the second node;

a second pull-up p-channel transistor having a source connected to the power supply, a drain connected to the second node, and a gate connected to the first node;

a second pull-down n-channel transistor having a source connected to the ground voltage supply, a drain connected to the second node, and a gate connected to the first node;

a first n-channel pass transistor having a gate connected to a write word line, and a channel connected between the first node and a first write bit line;

a second n-channel pass transistor having a gate connected to the write word line, and a channel connected between the second node and a second write bit line;

a first p-channel pass transistor having a gate connected to an inverse write word line, and a channel connected between the first node and the first write bit line;

a second p-channel pass transistor having a gate connected to the inverse write word line, and a channel connected between the second node and the second write bit line;

a read-port inverting p-channel transistor having a gate connected to the second node, a source connected to the power supply, and a drain connected to a first read-port node;

a read-port pass p-channel transistor having a gate connected to an inverse read word line, and a channel connected between the first read-port node and a read bit line;

a read-port inverting n-channel transistor having a gate connected to the second node, a source connected to the ground voltage supply, and a drain connected to a second read-port node; and a read-port pass n-channel transistor having a gate connected to a read word line, and a channel connected between the second read-port node and the read bit line;

wherein each row in the array of memory cells has a write word line, an inverse write word line, a read word line, and an inverse read word line that connect to memory cells in a row;

wherein each column in the array of memory cells has a first write bit line, a second write bit line, and a read bit line that connect to memory cells in the column, whereby the memory cell has four word lines and three bit lines;

wherein the power supply is a logic power supply that is also used by logic cells in a chip that includes the multi-port-cell memory;

wherein each row further comprises;

a write word line driver that drives the power supply onto the write word line when the row is selected and being written, and that connects the ground voltage supply to the write word line when the row is not selected and being written;

an inverse write word line driver that connects the ground voltage supply to the inverse write word line when the row is selected and being written, and that connects the power supply voltage to the inverse write word line when the row is not selected and being written;

a read word line driver that drives the power supply onto the read word line when the row is selected and being read, and that connects the ground voltage supply to the read word line when the row is not selected and being read;

an inverse read word line driver that connects the ground voltage supply to the inverse read word line when the row is selected and being read, and that connects the power supply voltage to the inverse read word line when the row is not selected and being read;

wherein each column further comprises:

a write bit line driver that connects the power supply to the first write bit line when an input data bit is high and writing is enabled, and that connects the ground voltage supply to the first write bit line when the input data bit is low and writing is enabled;

an inverse write bit line driver that connects the power supply to the second write bit line when the input data bit is low and writing is enabled, and that connects the ground voltage supply to the second write bit line when the input data bit is high and writing is enabled;

a read amplifier that generates an output data bit that is high when the read bit line is high during a read, and that generates the output data bit that is low when the read bit line is low during a read;

wherein the first write bit line and the second write bit line are not connected to the read amplifier and are not used for reading but only for writing;

a metal line that shorts together the first read-port node and the second read-port node;

wherein the read-port pass p-channel transistor and the read-port pass n-channel transistor comprise a transmission gate.

2. A Static Random Access Memory (SRAM) cell comprising:

a write-only SRAM cell that comprises:

a first pull-up transistor and a first pull-down transistor connected in series between a power supply and a ground, the first pull-up transistor and the first pull-down transistor connected at a first latch node;

a second pull-up transistor and a second pull-down transistor connected in series between the power supply and the ground, the second pull-up transistor and the second pull-down transistor connected at a second latch node;

wherein gates of the first pull-up transistor and of the first pull-down transistor are driven by the second latch node between the second pull-up transistor and the second pull-down transistor;

wherein gates of the second pull-up transistor and of the second pull-down transistor are driven by the first latch node between the first pull-up transistor and the first pull-down transistor;

a first n-channel pass transistor connected between the first latch mode and a first write bit line, and having a gate connected to a write word line;

a second n-channel pass transistor connected between the second latch node and a second write bit line, and having a gate connected to the write word line;

a first p-channel pass transistor connected between the first latch node and the first write bit line, and having a gate connected to an inverse write word line;

a second p-channel pass transistor connected between the second latch node and the second write bit line, and having a gate connected to the inverse write word lines;

a buffered read port that comprises:

a buffer transistor with a gate connected to the second latch node from the write-only SRAM cell, and a channel that conducts current controlled by the gate; and a pass transistor having a gate connected to a read word line and a channel connected between the channel of the buffer transistor and a read bit line;

wherein reading is performed by activating the read word line and sensing read data on the read bit line;

wherein writing is performed by activating the write word line high and the inverse write word line low and driving input data onto the first write bit line and driving an inverse of the input data onto the second write bit line;

wherein the buffered read port further comprises:

a p-channel buffer transistor with a gate connected to the second latch node from the write-only SRAM cell, and a channel that conducts current between the power supply and a first read-port node;

a p-channel pass transistor having a gate connected to an inverse read word line and a channel connected between first read-port node and the read bit line;

wherein the buffer transistor further comprises a n-channel buffer transistor with the gate connected to the second latch node from the write-only SRAM cell, and the channel that conducts current between the ground and a second read-port node;

wherein the pass transistor further comprises a n-channel pass transistor having the gate connected to the read word line and the channel connected between the second read-port node and the read bit line;

a metal line connected between the first read-port node and the second read-port node to short the first read-port node to the second read-port node;

wherein the p-channel pass transistor and the n-channel pass transistor comprise a transmission gate.

* * * * *